(12) United States Patent
Haymore et al.

(10) Patent No.: US 12,745,577 B2
(45) Date of Patent: Sep. 22, 2026

(54) METHOD OF OPERATING A PVD APPARATUS

(71) Applicant: SPTS Technologies Limited, Newport (GB)

(72) Inventors: Scott Haymore, Newport (GB); Tony Wilby, Newport (GB); Steve Burgess, Newport (GB)

(73) Assignee: SPTS Technologies Limited, Newport (GB)

( * ) Notice: Subject to any disclaimer, the term of this patent is extended or adjusted under 35 U.S.C. 154(b) by 371 days.

(21) Appl. No.: 18/244,904

(22) Filed: Sep. 11, 2023

(65) Prior Publication Data

US 2024/0177997 A1 May 30, 2024

(30) Foreign Application Priority Data

Nov. 25, 2022 (GB) .................................... 2217714

(51) Int. Cl.
*H10P 14/44* (2026.01)
*C23C 14/02* (2006.01)
(Continued)

(52) U.S. Cl.
CPC ............ *H10P 14/44* (2026.01); *C23C 14/021* (2013.01); *C23C 14/345* (2013.01);
(Continued)

(58) Field of Classification Search
CPC ......... H01L 21/2855; H01L 2224/0345; H01L 2224/0381; C23C 14/021; C23C 14/345;
(Continued)

(56) References Cited

U.S. PATENT DOCUMENTS 6,132,564 A * 10/2000 Licata .................. C23C 14/022 204/192.15
6,187,151 B1 2/2001 Leiphart
(Continued)

FOREIGN PATENT DOCUMENTS

CN 110512181 A * 11/2019 .......... C23C 14/165
WO 9926281 A1 5/1999
WO WO-2023034480 A1 * 3/2023 ............ C23C 14/50

OTHER PUBLICATIONS

IPO, Search Report for GB2217714.1, May 26, 2023.
EPO, Extended European Search Report issued for EP Application No. 23194488.5, Mar. 5, 2024.

*Primary Examiner* — Mamadou L Diallo
(74) *Attorney, Agent, or Firm* — Hodgson Russ LLP

(57) ABSTRACT

A PVD apparatus can perform a cleaning step and a deposition step on an electrically conductive feature formed on a semiconductor substrate. The semiconductor substrate with the electrically conductive feature thereon can be positioned on the substrate support. A cleaning step can be performed to remove material from the electrically conductive feature predominantly by etching with ions of an inert gas while the target is simultaneously sputtered. A deposition step is performed by applying no RF bias to the substrate support or applying an RF bias which is less than the RF bias applied to the substrate support during the cleaning step and supplying an electrical signal having an associated electrical power to the target. The RF bias, if present, and electrical power are sufficient to deposit an electrically conductive deposition material onto the electrically conductive feature by PVD.

19 Claims, 3 Drawing Sheets

(51) Int. Cl.

| | |
|---|---|
| ***C23C 14/34*** | (2006.01) |
| ***H01J 37/32*** | (2006.01) |
| ***H01J 37/34*** | (2006.01) |
| ***H10P 70/00*** | (2026.01) |

(52) U.S. Cl.
CPC .... *H01J 37/32082* (2013.01); *H01J 37/3464* (2013.01); *H10P 70/27* (2026.01); *H01J 2237/332* (2013.01); *H01J 2237/335* (2013.01)

(58) Field of Classification Search
CPC .... C23C 14/34; C23C 14/50; H01J 37/32082; H01J 2237/335; H01J 37/32862
See application file for complete search history.

(56) References Cited

U.S. PATENT DOCUMENTS

| | | | | |
|---|---|---|---|---|
| 7,744,735 | B2 | 6/2010 | Robison et al. | |
| 2001/0001190 | A1 | 5/2001 | Leiphart | |
| 2002/0182887 | A1* | 12/2002 | Pavate | H01L 23/53238 438/767 |
| 2003/0034244 | A1 | 2/2003 | Yasar et al. | |
| 2018/0209035 | A1* | 7/2018 | Liu | C23C 14/48 |
| 2021/0140029 | A1* | 5/2021 | Ow | C23C 14/022 |
| 2022/0115352 | A1* | 4/2022 | Chuang | H01L 24/32 |
| 2022/0162737 | A1 | 5/2022 | Lariviere et al. | |
| 2022/0364230 | A1* | 11/2022 | Li | C23C 16/045 |
| 2023/0067466 | A1* | 3/2023 | Lin | C23C 14/545 |
| 2024/0222152 | A1* | 7/2024 | Rye | H01L 21/67034 |

* cited by examiner

METHOD OF OPERATING A PVD APPARATUS

CROSS-REFERENCE TO RELATED APPLICATIONS

This application claims priority to the UK patent application filed Nov. 25, 2022 and assigned App. No. 2217714.1, the disclosure of which is hereby incorporated by reference.

FIELD OF THE DISCLOSURE

This invention relates to a method of operating a PVD (Physical Vapor Deposition) apparatus, with particular reference to a method of operating a PVD apparatus in a cleaning mode to remove material from an electrically conductive feature formed on a semiconductor substrate. The invention relates also to an associated PVD apparatus capable of operating in a cleaning mode.

BACKGROUND OF THE DISCLOSURE

Advanced packaging technologies are a vitally important part of semiconductor fabrication processes, and play a key role in driving miniaturization of devices. As devices continue to shrink in size and contacts increase in density, Back end of line (BEOL) processing is receiving increased attention due to the desire that devices continue to shrink in size and contacts increase in density. Improvements in BEOL processing represent a potential route to increased device efficiency.

A key aspect of BEOL processing is the creation of a low resistance contact on the packaging side of a wafer at the interface between aluminium pads and titanium under bump metallization (UBM) layers prior to bump formation.

Before deposition of Ti—Cu contact layers, the wafers need to be patterned. This process results in the aluminium pads being exposed to atmosphere and thus oxidized. This electrically resistive oxide layer must be removed prior to the deposition of the Ti layer for a good electrical contact to be formed. The removal of the oxide layer is achieved by sputter etching the Al pads in a pre-cleaning (sputter etch) module, after which the wafer is transferred under vacuum to a Physical Vapor Deposition (PVD) chamber, where deposition of Ti is performed.

FIG. 1 is a schematic diagram showing a conventional prior art PVD cluster tool of the type used to perform UBM metallization processes. Wafers are loaded into cassettes or Front Opening Unified Pods (FOUPs) and placed in vacuum cassette elevators (VCEs) or equipment front end modules (EFEMs) 1 for processing. The wafers are transferred through slot valves or load locks to enter a transport module 2 which operates under vacuum. In a typical metal contact application, the wafer is degassed in a pre-heat station 3 where volatile materials are removed from the wafer and the wafer will be brought close to the required temperature. The wafer is then moved to the sputter etch (pre-cleaning) module 4 where a plasma is used to sputter clean the wafer using an inert gas such as Ar and or He. In this step AlOx is removed from the open aluminium bond pads. Once the sputter clean step is complete, the chamber returns to base pressure and the wafer 5 is transferred to a PVD deposition module 7. Movement of the wafer within the transport module is achieved through the use of a vacuum robot 6. As is well understood in the art, PVD deposition onto the wafer is typically accomplished by applying a negative DC voltage to a target in the presence of an inert gas such as Ar at low pressure (typically about 1-100 mTorr) to sputter target material onto the wafer surface. However, the skilled reader will appreciate that sputtering can be achieved using other well-known variations of the basic PVD methodology. Commercial production tools can have number of pre-heat, sputter etch (pre-cleaning) and PVD deposition modules. As the pre-cleaned aluminium surface is very reactive, exposure to any oxygen containing gases will rapidly result in regrowth of an AlOx layer on the Al bond pad. In a standard prior art process sequence a degas step is followed by the pre-clean sputter etch step. Then, PVD deposition of a titanium adhesion/barrier layer is followed by PVD deposition of a copper seed layer. It has been found that typically it can take 30 s between the end of the pre-clean sputter etch step and the beginning of the titanium PVD deposition step.

Patterning of the aluminium bond pads is typically accomplished using an organic polymer mask, such as a polyimide mask. Unfortunately, this gives rise to a significant problem. More specifically, the act of etching the wafer in the pre-cleaning module not only clears the thin oxide layer from the Al pads but also causes a breakdown in the patterned organic polymer mask layer, which releases oxidizing species, such as CO, into the pre-cleaning (etch) module. This process is depicted in FIG. 2, which shows an aluminium bondpad 20 on a passivation layer 22. The aluminium bondpad is masked by an organic polymer mask 24 such as a polyimide (PI), polybenzoxazole (PBO) or benzocyclobutene (BCB) mask. Sputtering by argon ions 26 produces oxidizing species such as CO 28. Even under the most favourable circumstances, the time taken to transfer the wafer between the pre-cleaning (etch) module and the deposition chamber (which as noted above is typically around 30 s) is more than sufficient for the oxidizing species released through sputter etching of the mask during pre-cleaning to react with the Al surface. This results in the regrowth of a thin oxide layer on exposed Al pads within a few seconds. Minimizing the thickness of this regrown oxide layer is key to minimizing the contact resistance.

In traditional PVD systems used for UBM, this problem has been controlled by extended high temperature degassing of the wafer before etching to remove gaseous impurities, by careful control of wafer temperature during the etch process to minimize polymer breakdown, and by reducing the transfer time between etch and deposition chambers. However, these approaches are inherently capable only of ameliorating the problem of the regrown oxide layer on the wafer. None of these approaches are capable of removing an oxide layer which has regrown following treatment in the pre-cleaning module.

Therefore, what is required is an improved processing method which can further reduce contact resistance without reducing system productivity. The present invention, in at least some of its embodiments, addresses the above described problems, desires and requirements. In particular, the present invention, in at least some of its embodiments, provides a way of partially or completely removing regrown oxide layers of the type described above. Although the invention provides particular advantages in the metallization of aluminium, the invention is not limited to these applications, and instead finds more general application in the removal of resistive layers from metallic features prior to metallization by PVD.

BRIEF SUMMARY OF THE DISCLOSURE

According to a first aspect of the invention there is provided a method of operating a PVD apparatus to perform a cleaning step and a deposition step on an electrically conductive feature formed on a semiconductor substrate comprising the steps of:

providing a PVD apparatus comprising a chamber having a substrate support, a target, an RF bias signal supply for applying an RF bias to the substrate support and an electrical signal supply for supplying an electrical signal to the target;

positioning the semiconductor substrate with the electrically conductive feature thereon on the substrate support;

performing a cleaning step by introducing at least one inert gas into the chamber, applying an RF bias to the substrate support and supplying an electrical signal having an associated electrical power to the target, wherein the RF bias and electrical power are sufficient to remove material from the electrically conductive feature predominantly by etching with ions of the inert gas while the target is simultaneously sputtered; and performing a deposition step by applying no RF bias to the substrate support or applying an RF bias which is less than the RF bias applied to the substrate support during the cleaning step and supplying an electrical signal having an associated electrical power to the target, wherein the RF bias, if present, and electrical power are sufficient to deposit an electrically conductive deposition material onto the electrically conductive feature by PVD.

The substrate support can be at a first position during the cleaning step and at a second position during the deposition step, wherein the second position is closer to the target than the first position. The first position of the substrate support can correspond to a target to semiconductor substrate separation of greater than 100 mm.

The second position of the substrate support can correspond to a target to semiconductor substrate separation of less than 75 mm, optionally to a target to semiconductor substrate separation in the range 25 to 70 mm.

The electrical power to the target used during the deposition step can be greater than the electrical power used during the cleaning step.

The electrical signal supplied to the target can be a DC electrical signal. Alternatively, the electrical signal supplied to the target can be an RF or pulsed DC electrical signal. For applications such as deposition of titanium, DC or pulsed DC is preferred because these techniques are associated with superior deposition rates. In principle, the type of electrical signal supplied to the target can be varied between the cleaning and deposition steps, but in practice it is generally more convenient to use a single type of electrical signal (for example, only DC) in both steps.

The electrical power to the target used during the cleaning step can be less than 500 W, and optionally less than 200 W.

The electrical power to the target used during the deposition step can be greater than 1000 W, optionally in the range 2000 to 8000 W, and optionally in the range 3000 to 5000 W.

The RF bias applied to the substrate support during the cleaning step can result in a DC bias being applied to the semiconductor substrate. The DC bias can be greater than 70 V, optionally greater than 250 V and optionally in the range 250 to 500 V. DC bias can be readily measured using techniques which are well known to the skilled reader and which give substantially identical results. For example, with apparatus which use a metallic substrate support measurements may be made using a voltmeter and measuring circuit between the upper surface of the substrate support and ground (for example, the walls of the chamber). The majority of PVD apparatus are of this type. For a substrate support such as an electrostatic chuck (ESC), a metallic probe can be used.

The RF bias applied to the substrate support during the deposition step or the lack thereof can result in a DC bias being applied to the semiconductor substrate, wherein the DC bias is less than 25 V and optionally is in the range 10 to 20 V.

The RF bias applied to the substrate support during the cleaning step can be of a power in the range 400 to 700 W. If an RF bias is applied to the substrate support during the deposition step, then it is of low power, typically of a power less than 50 W. The RF bias applied to the substrate support during the deposition step can be of a power less than 50 W. It is possible for no RF bias to be applied to the substrate support during the deposition step.

The inert gas used during the cleaning step can be Argon. Alternatively, the inert gas can be Helium, Neon or Xenon. Typically, at least one inert gas is introduced into the chamber during the deposition step. For convenience, the same inert gas or gases are used during the cleaning and deposition steps. However, in principle it is possible to instead use different inert gases for the cleaning and deposition steps. The inert gas can be introduced into the chamber at a flow rate in the range 50 to 200 sccm during one or both of the cleaning and deposition steps.

The material which is removed from the electrically conductive feature can be a resistive layer which would otherwise reduce a contact resistance to the electrically conductive feature.

The material which is removed from the electrically conductive feature can be an oxide of a material that the electrically conductive feature is formed from. The electrically conductive feature can be formed from aluminium. The material which is removed from the electrically conductive feature can be aluminium oxide. The aluminium electrically conductive feature can be a bond pad for the semiconductor substrate.

The electrically conductive feature can be formed from an aluminium alloy, optionally Al/Si, Al/Cu or Al/Si/Cu. The material which is removed from the electrically conductive feature can be an oxide.

The electrically conductive feature can be formed from copper. The copper electrically conductive feature can be a constituent of a Damascene interconnection. The material which is removed from the copper electrically conductive feature can be one or more of titanium, tantalum, a nitride of titanium or a nitride of tantalum.

The electrically conductive deposition material deposited onto the electrically conductive feature can be titanium. Alternatively, the electrically conductive deposition material deposited onto the electrically conductive feature by PVD can be chromium, TiW, copper, tantalum, nickel or palladium.

The deposition of the electrically conductive deposition material onto the electrically conductive feature can be part of an Under Bump Metallization (UBM) process.

The semiconductor substrate can be a silicon substrate, such as a silicon wafer.

The semiconductor substrate can be in the form of one or more integrated circuits.

According to a second aspect of the invention there is provided a PVD apparatus for performing a cleaning step and a deposition step on an electrically conductive feature formed on a semiconductor substrate in accordance with the first aspect of the invention, the PVD apparatus comprising:

- a chamber having a substrate support;
- a target;
- an RF bias signal supply for applying an RF bias to the substrate support;
- an electrical signal supply for supplying an electrical signal to the target; and
- a controller, wherein the controller is configured to control the operation of the PVD apparatus in accordance with first aspect of the invention.

The controller can be configured to maintain the substrate support at a first position during the cleaning step and at a second position during the deposition step, wherein the second position is closer to the target than the first position.

In general, a magnetron assembly is disposed behind the target, as is well known to the skilled reader.

For the avoidance of doubt, whenever reference is made herein to 'comprising' or 'including' and like terms, the invention is also understood to include more limiting terms such as 'consisting' and 'consisting essentially'.

Whilst the invention has been described above, it extends to any inventive combination of the features set out above, or in the following description, drawings or claims. For example, any features disclosed in relation to the first aspect of the invention may be combined with any features disclosed in relation to the second aspect of the invention and vice versa.

DESCRIPTION OF THE DRAWINGS

Embodiments of the invention will now be described, by way of example only, with reference to the accompanying drawings, in which.

DETAILED DESCRIPTION OF THE DISCLOSURE

Figure 1:
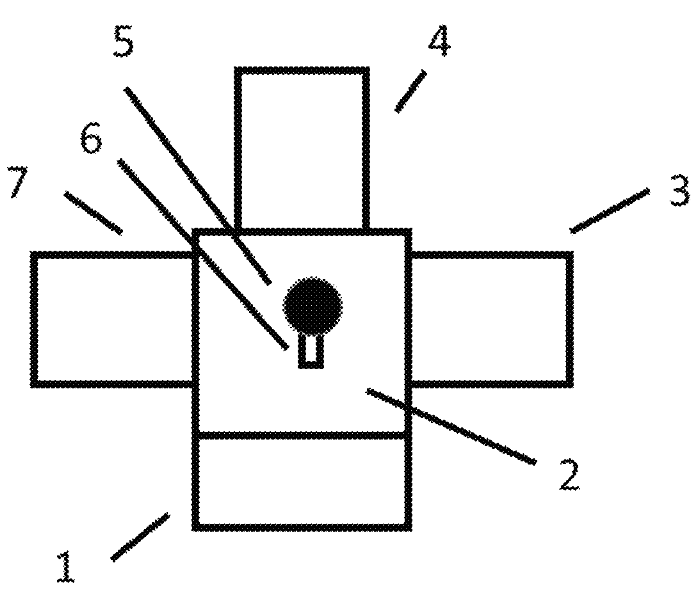
FIG. 1 is a schematic diagram of a prior art PVD cluster tool.
Figure 2:
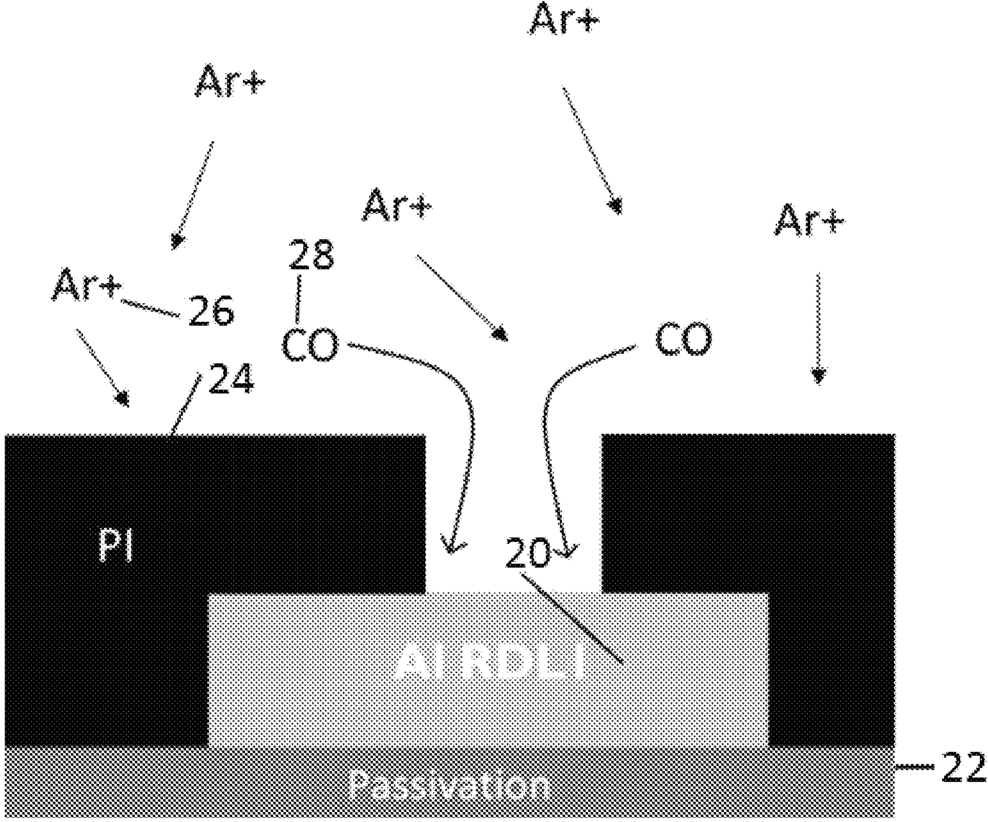
FIG. 2 is a schematic representation of an Al pad opening in a polyimide dielectric mask during argon ion etch clean.
Figures 3A, 3B:
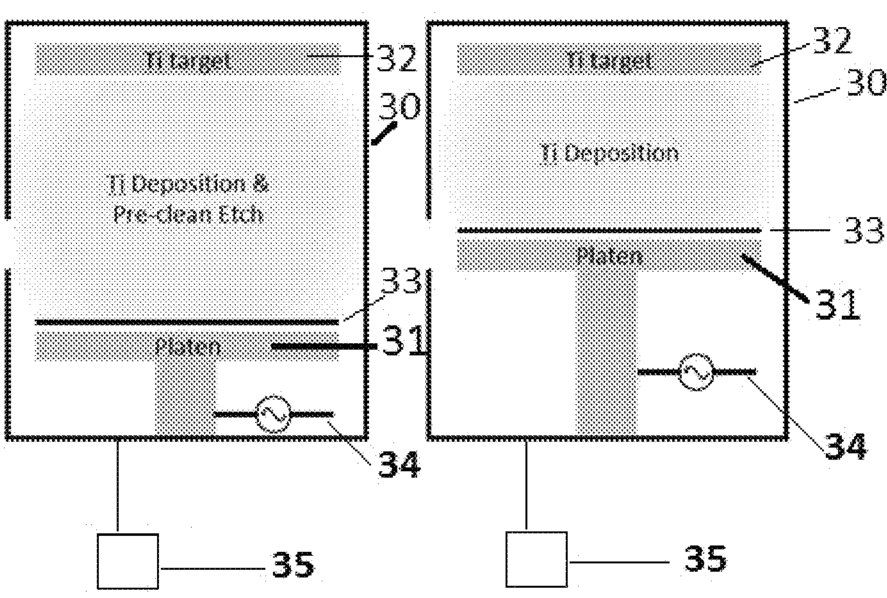
FIG. 3 is a schematic diagram of a PVD apparatus of the invention (a) during a cleaning step and (b) during PVD deposition.

FIGS. 3(*a*) and (*b*) show a PVD apparatus of the invention which is capable of operating in a cleaning mode to remove material from an electrically conductive feature formed on a semiconductor substrate. The apparatus comprises a chamber 30 comprising a substrate support 31, such as a platen, and a target 32. A semiconductor substrate 33 having an electrically conductive feature formed thereon is positioned on the substrate support 31. When required, an RF power supply 34 supplies an RF power to the substrate support 31 which generates a DC bias on the semiconductor substrate 33. A DC power supply (not shown) is used to supply DC power to the target 32. The DC power supply is also used to generate and maintain a plasma during PVD deposition but also performs a role during a cleaning step that is performed prior to the PVD deposition. The gap shown on the left hand side of the chamber 30 in FIGS. 3(*a*) and (*b*) corresponds to the entrance slot for a shutter. However, the shutter is not required for the operation of the apparatus in accordance with the invention. In fact, it is an advantage that additional hardware, such as a shutter, is not required. The apparatus further comprises a suitable gas inlet system (not shown) for introducing a desired process gas or gases (in this example Argon) into the chamber 30. A controller 35 is provided which is configured to control the apparatus to perform the method of the invention.

The present invention comprises a process which reduces the exposure time between a PVD deposition step and an immediately previous cleaning step. This is achieved by performing the immediately previous cleaning step in the PVD apparatus that is used to perform the PVD deposition. In other words, the PVD apparatus is operated in two modes: a first mode in which a cleaning step is performed and a second mode in which a deposition step is performed. The present inventors have found that the cleaning step and the deposition step must be performed quite carefully for the overall process to provide good results and for the apparatus to be able to rapidly switch between the cleaning step and the deposition step. A cleaning and deposition process for a wafer semiconductor substrate having an organic dielectric mask with open Al contact pads in is now described as follows. The wafer is transferred under vacuum into a PVD apparatus which is capable of operating in the two modes. FIG. 3(*a*) shows operation of the PVD apparatus in the first mode. In the first mode, the DC power supply supplies DC power to the target 32 so that the target is sputtered. Additionally, the RF power supply 34 supplies an RF power to the substrate support 31 which generates a DC bias on the semiconductor substrate 33. As a result, there is a net removal of material from both the wafer and the target. FIG. 3(*b*) shows operation of the PVD apparatus in the second mode. In the second mode there is no or very low DC bias applied to the semiconductor substrate 33. However, the DC power supplied to the target 32 is increased. PVD deposition takes place as the deposition rate from the target increases.

In the first, cleaning mode a high DC bias (Vdc) is applied to the wafer while the target is powered. This ensures that the etch rate of the wafer is greater than the deposition rate onto the wafer surface, which corresponds to a cleaning mode. These conditions can then be instantly changed to a net deposition process partly by reducing the DC bias on the wafer. It has been found that the switch between the cleaning step and the deposition step can be improved by moving the substrate support towards the target and increasing the power to the target. When the substrate support reaches the final process position—chosen for optimum deposition rate and uniformity—the DC power to the target can be increased and the DC bias on the wafer can be reduced to a lower value if bias is required or switched off altogether. In principle, other techniques such as pulsed DC or RF could be used to provide a negative potential to the target. By applying a power to the target during the cleaning step, the target is simultaneously cleaned of any potential contaminants which have been etched from the wafer. A further advantage is that it is not necessary to wait for hardware such as a shutter to be deployed or for stabilization of the target strike process to occur before deposition can commence. Additionally, it is believed that powering the target during the cleaning step provides a pasting effect whereby etch byproducts are attached to the walls of the chamber.

A more detailed, 12 step process sequence is provided below. The process sequence relates to a Ti barrier/adhesion deposition chamber configured for 300 mm wafers, although it will be appreciated that the sequence, or an adapted version of it, can pertain to other scenarios. The operation of the process sequence can be controlled using the controller 35.

Figure 4A:
FIG. 4 shows (a) a prior art process sequence for Ti deposition and (b) a simplified process sequence for Ti deposition in accordance with the invention.
Figure 4B:

1. Wafer is handled into the chamber
2. Platen moves to etch process height
3. Gas is introduced into the chamber
4. Target strikes at extremely low (<0.5 kW) DC power and process timer for step 1 starts
5. Platen strike sequence at BKM (100-600 W) RF power
6. Platen RF power turns off
7. Process timer for step 1 stops
8. Platen moves to deposition process height, target DC power ramps to step 2 power
9. Process timer for step 2 starts
10. Process timer ends, gas flow stopped
11. Platen returns to home position
12. Wafer is handled out of chamber A standard prior art process sequence for Ti deposition following pre-cleaning of the Al bondpad in another chamber (a separate etch chamber) is shown in FIG. 4(*a*). After pre-cleaning, the wafer is transported under vacuum by a robot from the etch chamber to a PVD module and placed onto a wafer support. The platen assembly is raised to the deposition height. This height will depend on process requirements but will typically be 2-6 cm. The chamber is brought to process pressure when a gas such as Ar is introduced into the chamber and the Ti sputtering step starts when DC power (4-20 kW typically) is applied to the Ti target which has a rotating magnetron assembly behind it. When the required film thickness is achieved, DC power to the target is removed and the Ar gas flow is stopped. The platen/wafer support is then lowered to the handling height and the vacuum robot removes the wafer from the platen and moves the wafer to the next process station. As noted previously, these prior art processes suffer the severe drawback that, in the time it has taken for the wafer to be handled into the chamber (typically about 40 s), an oxide interface will have regrown on the surface.

For ease of comparison, a simplified process sequence for Ti deposition using a PVD module of the invention is presented in FIG. 4(*b*). After handling the wafer onto the platen of the PVD module, the module is operated in the first mode to achieve pre-cleaning of the Al bondpad in situ by sputter etching with Ar+ ions. Subsequently, the PVD module is operated in the second mode to deposit Ti. When the required thickness of Ti has been deposited onto the wafer, target power and gas flow is turned off and the platen lowered to handling height. Finally, the wafer is removed from the PVD module by the vacuum robot. Due to the very short time of transfer from the sputter etch position to the deposition position the amount of oxide regrowth that can occur from polymer breakdown is greatly reduced. Additionally, the in-situ pre-clean process saves ~30-40 s over the conventional process sequence.

Test were conducted using the Applicant's single wafer 300 mm Sigma™ PVD tool with de-gas module, pre-clean chamber and a PVD chamber using a rotating magnetron and a Ti target with long throw spacing (~165 mm target to wafer spacing) and an RF driven wafer support with a 550 W, 13.56 MHz RF supply. The target was powered by a DC power supply. The wafer support is temperature controlled through resistive heating and a cooling system and can accommodate ~110 mm movement in the Z direction (i.e. reducing the gap between wafer and target). The chamber is metallic, typically constructed using Al or an Al alloy, and is electrically grounded.

It was possible to achieve both very low power sputtering from the target while maintaining Ar+ sputter etching of the wafer. The chosen target to substrate distance results in a deposition rate during the cleaning step which is sufficiently low that it results in very low deposition rates of metal onto the wafer surface while the bias (Vdc) is high enough to ensure that more material is removed than arrives at the wafer surface. The substrate to wafer spacing could be reduced by making modifications to the magnetron design to modify plasma density or by other means to maintain the plasma to achieve net removal of target material and also removal of contaminants from the wafer which reach the target.

Typical but non-limiting process conditions for the etch clean and deposition steps for 300 mm wafers are presented in Tables 1 and 2, respectively.

TABLE 1

Exemplary etch clean conditions.

| Parameter | Units | Typical |
|---|---|---|
| Ar Gas | sccm | 150 |
| Pressure | mT | 3.6 |
| Target Power | kW | 0.1 |
| Target Voltage | V | 187 |
| Target Current | A | 0.5 |
| Platen RF Power | W | 550 |
| DC Bias | V | 408 |
| Target to wafer | mm | 165 |

TABLE 2

Exemplary deposition conditions.

| Parameter | Units | Typical | Preferred |
|---|---|---|---|
| Ar Gas | sccm | 50-200 | 100 |
| Pressure | mT | 2-4 | 3 |
| Target Power | kW | 2-8 | 4 |
| Target Voltage | V | 350-400 | 380 |
| Target Current | A | 5-20 | 10 |
| DC Bias | V | 10-20 | 14 |
| Target to wafer | mm | 56-65 | 57.5 |

Figure 5:
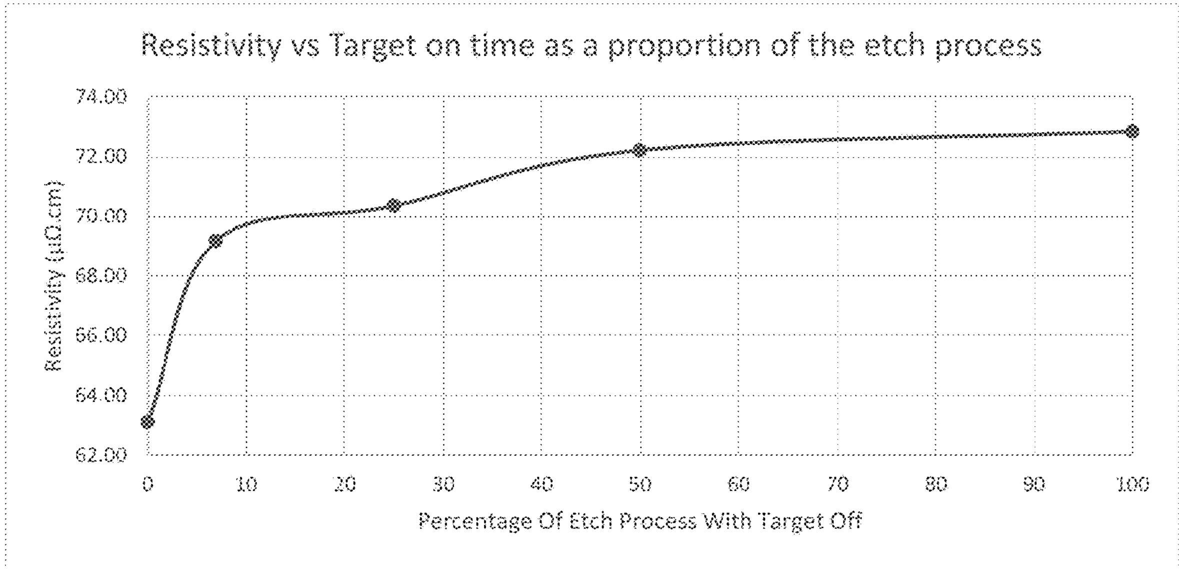
FIG. 5 is a graph showing resistivity of deposited Ti against percentage of time during the cleaning step that the target is not powered.

It was found that target contamination due to byproducts from the organic dielectric generated during the cleaning step can strongly influence the resistivity of a deposited Ti film. Tests were conducted with 300 mm polyimide coated wafers to explore the sensitivity of the resistivity of 100 nm Ti films as a function of the delay in applying DC to the target to commence the target plasma. The results are shown in FIG. 5 and Table 3. Resistivity values are determined by a 4-point probe.

The results show that it is vital that the target is also powered during the cleaning step for preservation of a clean target surface.

TABLE 3

Etch clean process with no target power vs resistivity (μΩ · cm).

| Percentage PI Etch Clean Process with No Target Power | Subsequent Deposited Film Resistivity (μΩ · cm) |
|---|---|
| 0 | 63.10 |
| 7 | 69.15 |
| 25 | 70.35 |
| 50 | 72.21 |
| 100 | 72.84 |

As can be seen in Table 2, even for a process with a relatively small amount of etch only plasma (7 sec), an 11% increase in film resistivity was observed. Therefore, maintaining a target plasma during deposition has the dual benefit of allowing for instantaneous switching between cleaning/deposition processes while also allowing for film resistivity to match the film resistivities achieved using traditional process in which pre-cleaning is performed in a separate chamber.

The present invention can be readily incorporated into HVM (high volume manufacturing). This can be done in a cluster tool using a process sequence in which an initial sputter etch step is performed in a dedicated sputter etch module on the cluster tool and then a final pre-clean is carried out in the deposition module for reasons of productivity. However, it would also be practical to use a deposition module for both a complete pre-clean and a deposition step. In this way, it is possible to avoid using a pre-clean module at all.

Apparatus in accordance with the invention can be manufactured as new. However, it is possible to retrofit or otherwise adapt existing PVD apparatus, such as by providing a suitable controller or by reprogramming an existing controller.

Although the invention has been exemplified in relation to the removal of aluminium oxide from an aluminium feature prior to PVD deposition of titanium, the invention is not limited to these embodiments. For example, Al alloys such as Al/Si, Al/Cu or Al/Si/Cu can also be processed in accordance with the invention as they are all predominantly Al based and are susceptible to oxidation. However, it should be noted that the invention can be readily applied more widely than this still to other applications, such as metallization applications where removal of a resistive layer is desired to reduce contact resistance. For example, the invention can be applied to metallization applications involving deposition onto copper, such as Damascene interconnections. In principle, the invention can be used to deposit any material which can be deposited by PVD, such as chromium, TiW, copper, nickel or palladium. The way in which the invention is implemented can be readily adapted by the skilled reader based on the disclosure provided above. For example, another inert gas than Argon can be used, such as Helium, Neon or Xenon. Also, it is not necessary for the substrate support to be moved between the cleaning and deposition steps.

The invention claimed is:

1. A method of operating a PVD apparatus to perform a cleaning step and a deposition step on an electrically conductive feature formed on a semiconductor substrate comprising the steps of:

providing a PVD apparatus comprising a chamber having a substrate support, a target, an RF bias signal supply for applying an RF bias to the substrate support and an electrical signal supply for supplying an electrical signal to the target;

positioning the semiconductor substrate with the electrically conductive feature thereon on the substrate support;

performing a cleaning step by introducing at least one inert gas into the chamber, applying an RF bias to the substrate support and supplying an electrical signal having an associated electrical power to the target, wherein the RF bias and electrical power are sufficient to remove material from the electrically conductive feature predominantly by etching with ions of the inert gas while the target is simultaneously sputtered; and performing a deposition step by applying no RF bias to the substrate support or applying an RF bias which is less than the RF bias applied to the substrate support during the cleaning step and supplying an electrical signal having an associated electrical power to the target, wherein the RF bias, if present, and electrical power are sufficient to deposit an electrically conductive deposition material onto the electrically conductive feature by PVD, wherein the substrate support is at a first position during the cleaning step and at a second position during the deposition step, and wherein the second position is closer to the target than the first position.

2. The method according to claim 1, wherein the first position of the substrate support corresponds to a target to semiconductor substrate separation of greater than 100 mm.

3. The method according to claim 1, wherein the second position of the substrate support corresponds to a target to semiconductor substrate separation of less than 75 mm.

4. The method according to claim 1, wherein the electrical power to the target used during the deposition step is greater than the electrical power used during the cleaning step.

5. The method according to claim 4, wherein the electrical signal supplied to the target is a DC electrical signal.

6. The method according to claim 1, wherein the electrical power to the target used during the cleaning step is less than 500 W.

7. The method according to claim 1, wherein the electrical power to the target used during the deposition step is greater than 1000 W.

8. The method according to claim 1, wherein the RF bias applied to the substrate support during the cleaning step results in a DC bias being applied to the semiconductor substrate, wherein the DC bias is greater than 70 V.

9. The method according to claim 1, wherein the RF bias applied to the substrate support during the cleaning step or the lack thereof results in a DC bias being applied to the semiconductor substrate, wherein the DC bias is less than 25 V.

10. The method according to claim 1, wherein the inert gas is Argon.

11. The method according to claim 1, wherein the material which is removed from the electrically conductive feature is an oxide of a material that the electrically conductive feature is formed from.

12. The method according to claim 11, wherein the electrically conductive feature is formed from aluminium and the material which is removed from the electrically conductive feature is aluminium oxide.

13. The method according to claim 12, wherein the aluminium electrically conductive feature is a bond pad for the semiconductor substrate.

14. The method according to claim 11, wherein the electrically conductive feature is formed from aluminium alloy.

15. The method according to claim 1, wherein the electrically conductive feature is formed from copper and the material which is removed from the copper electrically conductive feature is one or more of titanium, tantalum, a nitride of titanium or a nitride of tantalum.

16. The method according to claim 1, wherein the electrically conductive deposition material deposited onto the electrically conductive feature is titanium.

17. The method according to claim 1, wherein the deposition of the electrically conductive deposition material onto the electrically conductive feature is part of an Under Bump Metallization (UBM) process.

18. A PVD apparatus for performing a cleaning step and a deposition step on an electrically conductive feature formed on a semiconductor substrate in accordance with the method of claim 1, the PVD apparatus comprising:

the chamber having the substrate support;

the target;

the RF bias signal supply for applying the RF bias to the substrate support;

the electrical signal supply for supplying the electrical signal to the target; and a controller, wherein the controller is configured to control positioning the semiconductor substrate, performing the cleaning step, and performing the deposition step.

19. The PVD apparatus according to claim 18, wherein the controller is configured to maintain the substrate support at a first position during the cleaning step and at a second position during the deposition step, wherein the second position is closer to the target than the first position.

* * * * *